US012727519B2

(12) United States Patent
Tu et al.

(10) Patent No.: US 12,727,519 B2
(45) Date of Patent: Sep. 1, 2026

(54) SEMICONDUCTOR PACKAGE METHOD AND SEMICONDUCTOR PACKAGE STRUCTURE

(71) Applicant: CR RUNAN TECHNOLOGIES (CHONGQING) CO. LTD., Chongqing (CN)

(72) Inventors: Xufeng Tu, Chongqing (CN); Yan Huo, Chongqing (CN)

(73) Assignee: CR Runan Technologies (Chongqing) Co. Ltd., Chongqing (CN)

( * ) Notice: Subject to any disclaimer, the term of this patent is extended or adjusted under 35 U.S.C. 154(b) by 443 days.

(21) Appl. No.: 18/547,864

(22) PCT Filed: Jun. 7, 2022

(86) PCT No.: PCT/CN2022/097361
§ 371 (c)(1),
(2) Date: Aug. 24, 2023

(87) PCT Pub. No.: WO2023/273808
PCT Pub. Date: Jan. 5, 2023

(65) Prior Publication Data

US 2024/0321846 A1 Sep. 26, 2024

(30) Foreign Application Priority Data

Jun. 29, 2021 (CN) ......................... 202110729591.6

(51) Int. Cl.
*H10W 90/00* (2026.01)
*H10D 1/00* (2025.01)
(Continued)

(52) U.S. Cl.
CPC .............. *H10W 90/00* (2026.01); *H10D 1/00* (2025.01); *H10W 74/019* (2026.01); *H10W 70/09* (2026.01); *H10W 70/6528* (2026.01)

(58) Field of Classification Search
CPC ......... H01L 25/16; H01L 24/19; H01L 24/20; H01L 21/568; H10D 1/00
See application file for complete search history.

(56) References Cited

U.S. PATENT DOCUMENTS 11,049,734 B2 6/2021 Chew
2001/0005053 A1 6/2001 Kitae et al.
(Continued)

FOREIGN PATENT DOCUMENTS

CN 101261976 A 9/2008
CN 105655310 A * 6/2016 ............. H01L 23/49
(Continued)

OTHER PUBLICATIONS

State Intellectual Property Office of the People's Republic of China, Office Action and Search Report Issued in Application No. 202110729591.6, Jul. 20, 2023, 14 pages. (Submitted with Machine/Partial Translation).

(Continued)

*Primary Examiner* — Mohammad M Choudhry
(74) *Attorney, Agent, or Firm* — McCoy Russell LLP

(57) ABSTRACT

This application provides a semiconductor package method and a semiconductor package structure. The semiconductor package method includes: disposing a substrate layer on a front surface of a passive device, where the front surface of the passive device is provided with electrical connectors, the substrate layer is provided with substrate-layer openings that run through two opposite surfaces of the substrate layer, and the substrate-layer openings correspond to the electrical connectors; forming a protective layer on a front surface of a die, and forming protective-layer openings on the protective layer, where the front surface of the die is provided with pads, and the protective-layer openings correspond to the pads on the front surface of the die; adhering the passive device and the die to a carrier plate in a spaced-apart (Continued)

manner; forming an encapsulation layer that encapsulates at least side surfaces of the die and side surfaces of the passive device.

11 Claims, 5 Drawing Sheets

(51) Int. Cl.

| | |
|---|---|
| ***H10W 74/01*** | (2026.01) |
| *H10W 70/09* | (2026.01) |
| *H10W 70/652* | (2026.01) |

(56) References Cited

U.S. PATENT DOCUMENTS

| | | | | |
|---|---|---|---|---|
| 2011/0068433 | A1 | 3/2011 | Kim et al. | |
| 2015/0041980 | A1 | 2/2015 | Ahn et al. | |
| 2018/0151393 | A1 | 5/2018 | Chew | |
| 2019/0371626 | A2 | 12/2019 | Chew | |
| 2020/0075510 | A1 | 3/2020 | Chang Chien et al. | |
| 2020/0203325 | A1* | 6/2020 | Lee | H01L 23/544 |
| 2021/0193717 | A1* | 6/2021 | Cho | H10F 39/182 |
| 2022/0415813 | A1* | 12/2022 | Tsai | H10D 1/20 |

FOREIGN PATENT DOCUMENTS

| | | | |
|---|---|---|---|
| CN | 106952886 | A | 7/2017 |
| CN | 108231606 | A | 6/2018 |
| CN | 110729270 | A | 1/2020 |
| CN | 112582283 | A | 3/2021 |
| CN | 113471086 | A | 10/2021 |
| JP | H0661609 | A | 3/1994 |

OTHER PUBLICATIONS

ISA State Intellectual Property Office of the People's Republic of China, International Search Report Issued in Application No. PCT/CN2022/097361, Jul. 28, 2022, WIPO, 5 pages.

ISA State Intellectual Property Office of the People's Republic of China, Written Opinion of the International Searching Authority Issued in Application No. PCT/CN2022/097361, Jul. 28, 2022, WIPO, 5 pages. (Submitted with Machine/ Partial Translation).

* cited by examiner

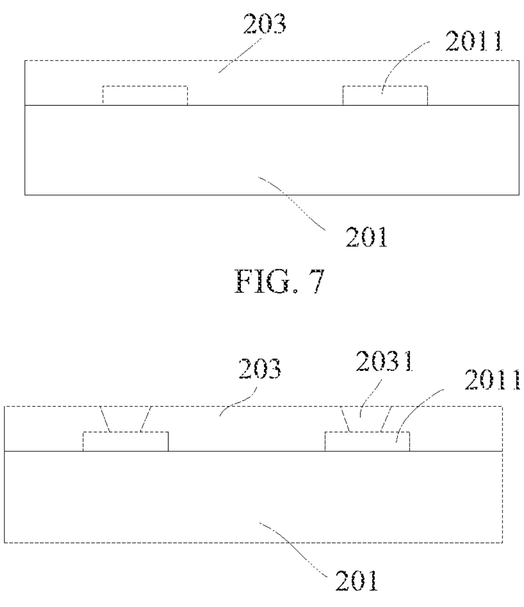
FIG. 7
FIG. 8
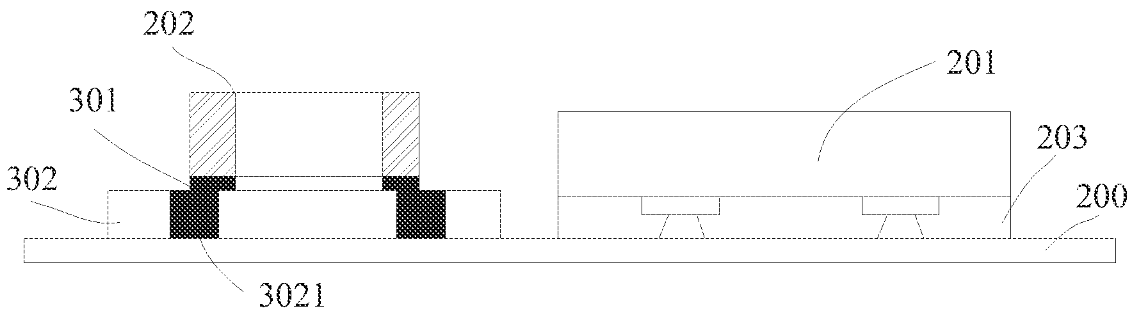
FIG. 9
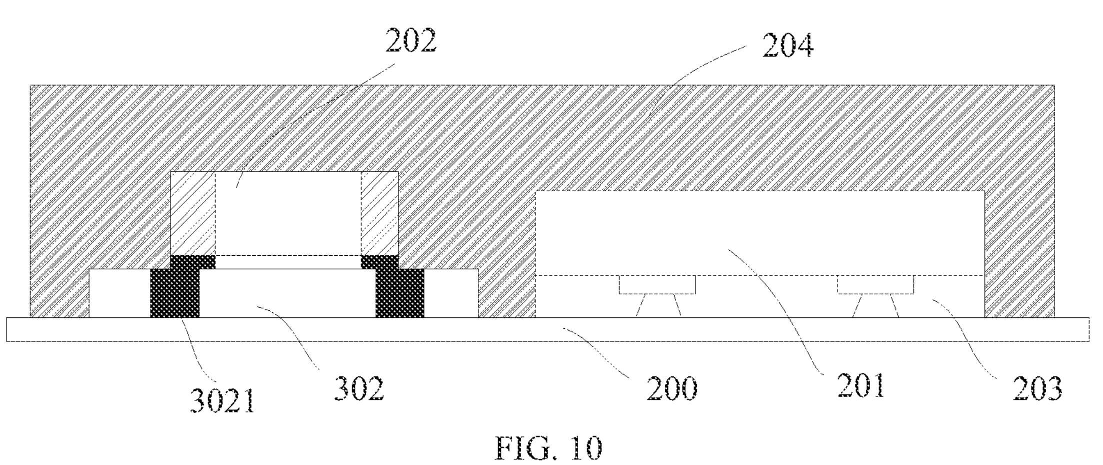
FIG. 10

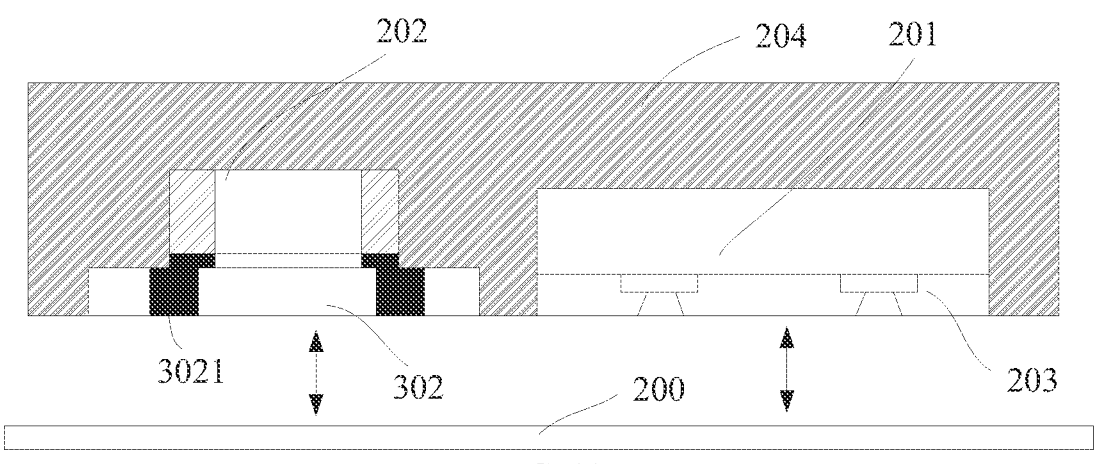
FIG. 11
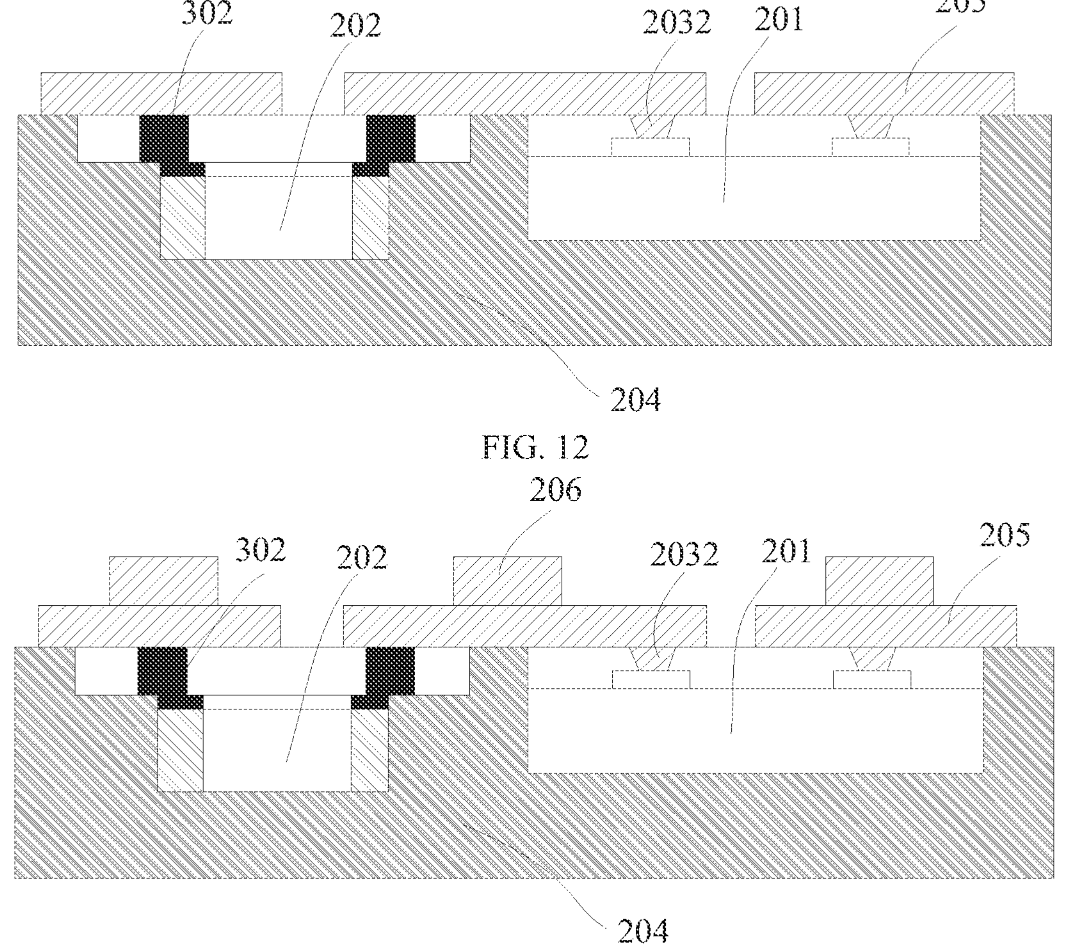
FIG. 12
FIG. 13

SEMICONDUCTOR PACKAGE METHOD AND SEMICONDUCTOR PACKAGE STRUCTURE

CROSS REFERENCE TO RELATED APPLICATIONS

This application is a national stage of International Application No. PCT/CN2022/097361, filed on Jun. 7, 2022, which claims priority to Chinese Patent Application No. 202110729591.6, filed on Jun. 29, 2021, which is hereby incorporated by reference in its entirety.

TECHNICAL FIELD

This application relates to the field of semiconductor technology, and in particular, to a semiconductor package method and a semiconductor package structure.

BACKGROUND

At present, in a semiconductor package process, dies and passive devices, such as capacitors, resistors and inductors, usually need to be packaged in one package body to realize some functions. Such package technology for the package body with dies and passive devices has always been concerned.

SUMMARY

In an aspect of the present application, there is provided a semiconductor package method, including:

- disposing a substrate layer on a front surface of a passive device, where the front surface of the passive device is provided with electrical connectors, the substrate layer is provided with substrate-layer openings that run through two opposite surfaces of the substrate layer, and the substrate-layer openings correspond to the electrical connectors;
- forming a protective layer on a front surface of a die, and forming protective-layer openings on the protective layer, where the front surface of the die is provided with pads, and the protective-layer openings correspond to the pads on the front surface of the die;
- adhering the passive device and the die to a carrier plate in a spaced-apart manner, where the front surface of the die faces toward the carrier plate, and the front surface of the passive device faces toward the carrier plate;
- forming an encapsulation layer that encapsulates at least side surfaces of the die and side surfaces of the passive device.

Main technical effects achieved by embodiments of the present application are:

In the semiconductor package method and the semiconductor package structure provided in the embodiments of the present application, by disposing substrate layers on surfaces of passive devices in advance, the technical problem that tin terminal surfaces of some passive devices cannot be directly packaged is solved, and it is beneficial to ensure the stability and the reliability of the passive devices. Forming the protective layer on the front surface of the die can protect the front surface of the die during plastic package, so as to prevent a plastic package material from penetrating and damaging the front surface of the die. The formation of substrate-layer openings and protective-layer openings enables the electrical connectors on the passive device and the pads on the front surface of the die to be accurately located through corresponding openings before subsequent panel level package technologies.

Details of one or more embodiments of this application will be provided in the following accompanying drawings and description. Other features, objectives and advantages of the present application will become apparent from the description, the accompanying drawings, and the claims.

BRIEF DESCRIPTION OF THE DRAWINGS

FIGS. 2 to 15 are diagrams illustrating technological processes of a semiconductor package method according to exemplary embodiments of the present application.

DETAILED DESCRIPTION OF THE EMBODIMENTS

Figure 1:
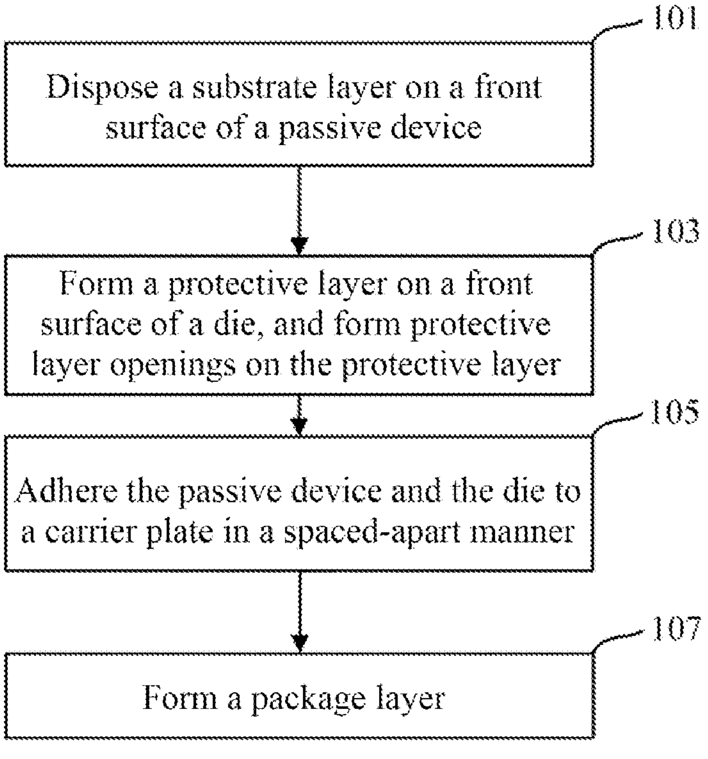
FIG. 1 is a flowchart illustrating a semiconductor package method according to an exemplary embodiment of the present application.
Figure 2:
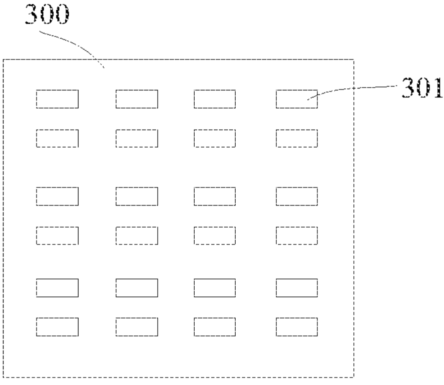

Exemplary embodiments will be described in detail herein, with the illustrations thereof represented in the drawings. When the following descriptions involve the drawings, same numerals in different drawings refer to same or similar elements unless otherwise indicated. The embodiments described in the following examples do not represent all embodiments consistent with the present application. Rather, they are merely examples of apparatuses and methods consistent with some aspects of the present application as detailed in the appended claims.

The terms used in the present application are for the purpose of describing particular embodiments only, and are not intended to limit the present application. Unless otherwise defined, technical or scientific terms used in this application should have ordinary meaning as understood by one of ordinary skill in the art to which the invention belongs. Similar words such as “one”, “a” or “an” used in the specification and claims of the present application do not represent a quantity limit, but represent that there is at least one. “Plurality”, “multiple” or “several” means two or more. Similar words such as “including” or “comprising” mean that an element or an item appearing before “including” or “comprising” covers elements or items and their equivalents listed after “including” or “comprising”, without excluding other elements or items. Similar words such as “connect” or “couple” are not limited to physical or mechanical connections, and may include electrical connections, whether direct or indirect. Similar words such as “upper” and/or “lower” are only for convenience of description, and are not limited to one position or one spatial orientation. Terms determined by “a/an”, “the” and “said” in their singular forms in the specification and claims of the present application are also intended to include plural forms unless clearly indicated otherwise in the context. It should also be understood that the term “and/or” as used herein refers to and includes any or all possible combinations of one or more associated listed items.

In a semiconductor package process, dies and passive devices, such as capacitors, resistors and inductors, usually need to be packaged in one package body to realize some functions. The present application provides a semiconductor package method. In the package process, first, a substrate layer is disposed on a front surface of a passive device, where the front surface of the passive device is provided with electrical connectors, the substrate layer is provided with substrate-layer openings that run through two opposite surfaces of the substrate layer, and the substrate-layer openings correspond to the electrical connectors; a protective layer is formed on a front surface of a die, and protective-layer openings are formed on the protective layer, where the front surface of the die is provided with pads, and the protective-layer openings correspond to the pads on the front surface of the die; next, the passive device and the die are adhered to a carrier plate in a spaced-apart manner, where the front surface of the die faces toward the carrier plate, and the front surface of the passive device faces toward the carrier plate; finally, an encapsulation layer that encapsulates at least side surfaces of the die and side surfaces of the passive device is formed. In the embodiments of the present application, by disposing substrate layers on surfaces of passive devices in advance, the technical problem that tin terminal surfaces of some passive devices cannot be directly packaged is solved, and it is beneficial to ensure the stability and the reliability of the passive devices. Forming the protective layer on the front surface of the die can protect the front surface of the die during plastic package, so as to prevent a plastic package material from penetrating and damaging the front surface of the die. The formation of substrate-layer openings and protective-layer openings enables the electrical connectors on the passive device and the pads on the front surface of the die to be accurately located through corresponding openings before subsequent panel level package technologies. In addition, compared to an embodiment in which a die and a passive device are respectively packaged and then connected through lead wires, copper sheets and other connection structures, adopting the package method in the present application helps to reduce a volume of a system level package structure, achieve product miniaturization, make the die and the passive device closer and a response time shorter, and improve the electrical performance of products.

As shown in FIG. 1 and FIGS. 2 to 15, the present application provides a semiconductor package method and a semiconductor package structure.

FIG. 1 is a flowchart illustrating a semiconductor package method according to an exemplary embodiment of the present application. As shown in FIG. 1, the semiconductor package method includes the following steps 101 to 107:

At step 101, a substrate layer is disposed on a front surface of a passive device, where the front surface of the passive device is provided with electrical connectors, the substrate layer is provided with substrate-layer openings that run through two opposite surfaces of the substrate layer, and the substrate-layer openings correspond to the electrical connectors.

At step 103, a protective layer is formed on a front surface of a die, and protective-layer openings are formed on the protective layer, where the front surface of the die is provided with pads, and the protective-layer openings correspond to the pads on the front surface of the die.

At step 105, the passive device and the die are adhered to a carrier plate in a spaced-apart manner, where the front surface of the die faces toward the carrier plate, and the front surface of the passive device faces toward the carrier plate.

At step 107, an encapsulation layer that encapsulates at least side surfaces of the die and side surfaces of the passive device is formed.

In some embodiments, as shown in FIGS. 2 to 5, step 101 may be implemented specifically through the following steps 1011 to 1014:

At step 1011, a substrate 300 is provided.

Materials for the substrate 300 may include FR-4, fiberglass or other materials.

At step 1012, solder joints 301 of multiple passive devices 202 arranged in preset positions are formed on a surface of the substrate 300. The surface on which the solder joints 301 are disposed may be understood as a front surface of the substrate 300.

In some embodiments, the solder joints 301 may be formed through exposure development. Materials for the solder joints 301 include copper metal, and of course, may include other metal materials that can conduct electricity and facilitate soldering, which is not limited in the present application.

At step 1013, the multiple passive devices 202 are soldered respectively to different solder joints 301 to form passive device assemblies.

The passive devices mentioned here may include electronic devices such as capacitors, resistors or inductors. Each passive device 202 has a front surface provided with electrical connectors. When the passive device 202 is correspondingly soldered to the solder joints 301, specifically, the front surface of the passive device 202 is soldered toward the substrate 300, and the electrical connectors of the passive device 202 are correspondingly soldered to the solder joints 301, so as to achieve electrical connection with the solder joints 301.

In some embodiments, multiple passive devices may be soldered respectively to different solder joints through reflow soldering. The operation of soldering the passive devices to the substrate through reflow soldering enables the passive devices to be soldered more firmly and stably.

At step 1014, the substrate 300 of the passive device assemblies is cut to form passive devices each provided with the substrate layer 302 on the front surface of the passive device 202.

Figure 4:
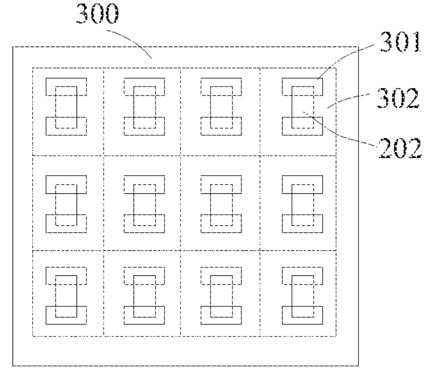

In some embodiments, the cutting may be performed along cutting lines shown by dotted lines in FIG. 4, and a portion of the substrate corresponding to the front surface of each passive device 202 is formed as the substrate layer 302.

It should be noted that, in a case where technological conditions allow, only a smaller substrate for soldering one passive device may be directly provided. Accordingly, the passive device is soldered to the substrate. There is no need to cut the substrate, so as to form a corresponding substrate layer.

Further, in some embodiments, after step 1014, the method includes the following step 1015:

At step 1015, the substrate-layer openings are provided on the substrate layer 302.

Figure 5:
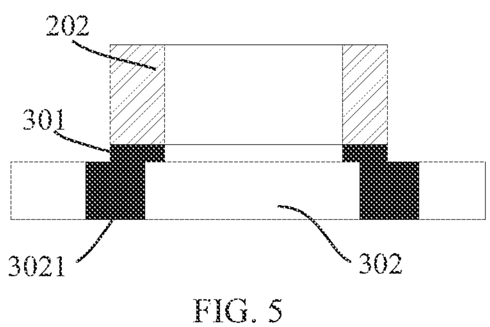

Optionally, after step 1015, the method includes the following step 1016:

At step 1016, the substrate-layer openings are filled with a first conductive medium to form first electrical connection portions 3021 electrically connected to the passive device 202. Therefore, a structure as shown in FIG. 5 is formed.

The first electrical connection portions 3021 may be electrically connected to the electrical connectors on the front surface of the passive device 202 specifically through the solder joints 301.

It should be noted that, in a case where technological conditions allow, the substrate-layer openings may be formed before the passive device is soldered to the substrate, which is not limited in the present application and may be set according to specific circumstances.

In step 103, the protective layer is formed on the front surface of the die, and the protective layer may be formed on a front surface of a semiconductor wafer before the semiconductor wafer is cut into a plurality of dies. Afterwards, the semiconductor wafer is cut to obtain the dies with protective layers formed on front surfaces of the dies. Of course, it can be understood that, in a case where technological conditions allow, the protective layer may be formed on the front surface of each die after the semiconductor wafer is cut into the dies. Manners of forming the protective layer may be selected according to specific application situations and is not limited in the present application.

Figure 6:
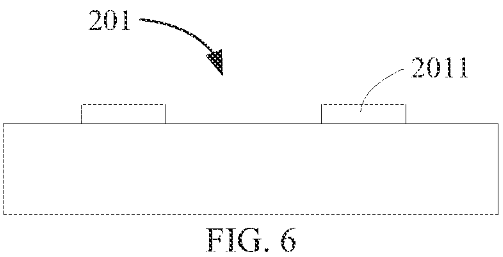

In some embodiments, as shown in FIG. 6, the front surface of the die 201 has the pads 2011. The pads 2011 are used for electrical connection with the outside.

Further, with reference to FIG. 7, the protective layer 203 is formed on the front surface of the die 201.

The protective layer 203 is made of insulating materials. Materials for the protective layer may include BCB (benzocyclobutene), PI (polyimide), PBO (polybenzoxazole), epoxy resin, ABF (Ajinomoto buildup film), polymer matrix dielectric film, organic polymer film, or other materials with similar insulating and structural characteristics. The materials for the protective layer may be organic/inorganic composite materials, for example, resin polymers added with inorganic particles. Optionally, materials that can adapt to chemical cleaning, grinding, etc. are preferentially selected as the materials for the protective layer 203. The protective layer 203 may be formed on the die 201 through lamination, coating, printing, or other methods.

Further, as shown in FIG. 8, the protective-layer openings 2031 are formed on the protective layer 203. The protective-layer openings 2031 correspond to at least the pads on the front surface of the die 201 or lines led out from the pads, so that the pads on the front surface of the die 201 or the lines led out from the pads are exposed from the protective-layer openings 2031. If the materials for the protective layer 203 are laser reactive materials, the protective-layer openings 2031 may be formed through laser patterning. If the materials for the protective layer 203 are photosensitive materials, the protective-layer openings 2031 may be formed through photolithographic patterning. The protective-layer openings 2031 may be circular, and of course, may also be other shapes such as oval, square, linear, etc.

It should be noted that FIGS. 6 to 8 illustrate only the formation of a protective layer on a front surface of one die 201 and the formation of protective-layer openings on the protective layer. Of course, for the formation of a protective layer on a front surface of a semiconductor wafer (corresponding to a front surface of a die) and the formation of protective-layer openings on the protective layer, reference may also be made to this method. Accordingly, after the protective layer is formed on the front surface of the semiconductor wafer, a back surface of the semiconductor wafer, which corresponds to a back surface of the die, may be ground to reduce a thickness of the die. Of course, in some embodiments, the back surface of the die may not be thinned, which is not limited in the present application and may be set according to specific application environments. Further, the semiconductor wafer is cut along cutting paths by using cutting equipment to obtain a plurality of dies with protective layers on their front surfaces. The cutting may be mechanical cutting or laser cutting. Further, protective-layer openings are formed on the protective layers. The protective-layer openings may be formed before or after the semiconductor wafer is cut.

It should be noted that step 101 and step 103 do not have a sequential order. Step 101 and step 103 may be performed simultaneously. Step 101 may be performed before or after step 103, which is not limited in the present application and may be set according to specific application environments.

In step 105, as shown in FIG. 9, the passive device 202 with the substrate layer 302 formed in step 101 and the die 201 with the protective layer 203 formed in step 103 are adhered to the carrier plate 200 in a spaced-apart manner in preset arrangement positions, where the front surface of the die 201 faces toward the carrier plate 200, and the front surface of the passive device 202 also faces toward the carrier plate 200. Arrangement positions for passive devices 202 and arrangement positions for dies 201 may be set in a spaced-apart manner. After the passive device 202 and the die 201 are adhered to the carrier plate 200, the protective-layer openings 2031 are still in a hollow state. Of course, if the first electrical connection portions 3021 are not formed in the substrate-layer openings before step 105, the substrate-layer openings are also in a hollow state.

Optionally, the passive device 202 with the substrate layer 302 may be adhered to the carrier plate through an adhesive layer (not shown). The adhesive layer is configured to adhere the passive device 202 with the substrate layer 302. Materials that are easily stripped may be used as materials for the adhesive layer, so as to strip the carrier plate and the passive device 202 with the substrate layer 302 in subsequent processes. For example, a thermal separation material that can lose its adhesion through heating may be used.

Optionally, in other embodiments, the adhesive layer may adopt a two-layer structure, including a thermal separation material layer and an attachment layer. The thermal separation material layer is adhered to the carrier plate 200. The thermal separation material layer will lose its adhesion during heating, and thereby can be stripped from the carrier plate 200. A material layer having adhesion is used as the attachment layer. The attachment layer is configured to adhere the passive device 202 with the substrate layer 302. After the passive device 202 with the substrate layer 302 is stripped from the carrier plate 200, the attachment layer may be removed through chemical cleaning. In an embodiment, the adhesive layer may be formed on the carrier plate 200 through lamination, printing, and other methods.

The die 201 with the protective layer 203 may be adhered to the carrier plate in the same way. For this, reference may be made to the above relevant description, which will not be repeated here.

It should be noted that, as shown in FIG. 9, the passive device 202 (i.e., the passive device 202 with the substrate layer 302) and the die 201 (i.e., the die 201 with the protective layer 203) are placed on the carrier plate 200 in preset arrangement positions. For the convenience of expression, only one passive device 202 and one die 201 are shown in the figure. In fact, there are multiple dies 201 and multiple passive devices 202 arranged in preset positions on the carrier plate 200. Optionally, the passive devices 202 and the dies 201 are disposed on the carrier plate 200 in a spaced-apart manner.

It can be understood that, in a single package process, both the dies and the passive devices may be multiple, that is, multiple passive devices with substrate layers and multiple dies with protective layers may be adhered to the carrier plate at the same time for package, and after completion of package, multiple package bodies are formed through cutting. One package body includes one group of passive devices and dies, and specifically, may include one or more passive devices and one or more dies. Positions for the one or more passive devices and the one or more dies may be set according to actual product needs.

In step 107, an encapsulation layer 204 is formed on the carrier plate 200, and the encapsulation layer 204 packages at least a portion of the die and at least a portion of the passive device. For example, the encapsulation layer 204 covers a surface of the passive device 202 away from the carrier plate 200, a surface of the die 201 away from the carrier plate 200, and exposed portions of the carrier plate. If there is an adhesive layer on the carrier plate, the encapsulation layer covers a surface of the passive device 202 away from the carrier plate, a surface of the die 201 away from the carrier plate 200, and exposed portions of the adhesive layer. Of course, if there is still an exposed region on a surface of the carrier plate 200 near the die 201 and the passive device 202, the exposed region is covered by the encapsulation layer. As shown in FIG. 10, the encapsulation layer 204 completely packages the carrier plate 200, the passive device 202 with the substrate layer 302 on its front surface, and the die 201 with the protective layer 203 to reconstruct a flat structure, so that, after the carrier plate 200 is striped, rewiring and repackage can be continuously performed on the reconstructed flat structure.

In an embodiment, the encapsulation layer 204 may be formed by laminating an epoxy resin film or ABF (Ajinomoto buildup film), or by injection molding, compression molding, or transfer molding an epoxy resin compound.

An upper surface of the encapsulation layer 204 away from the carrier plate 200 is substantially flat, and is parallel or substantially parallel to a surface of the carrier plate 200. A thickness of the encapsulation layer 204 may be reduced by grinding or polishing a surface of the encapsulation layer 204 away from the carrier plate 200.

When the encapsulation layer 204 is used for package, since the encapsulation layer needs to be high-pressure molded during its molding, in this process, package materials easily penetrate between the carrier plate 200 and the die 201 or between the carrier plate 200 and the passive device 202. The arrangement of the substrate layer 302 and the protective layer 203 in the present application can prevent the package materials from penetrating surfaces of the die 201 and the passive device 202, so that the package materials will not directly contact the front surface of the die 201 and the front surface of the passive device 202, and not cause damage to a circuit structure on the front surface of the die 201 and the passive device.

Further, as shown in FIG. 11, in some embodiments, after the encapsulation layer 204 is formed, the carrier plate 200 may be stripped. If there is an adhesive layer with a thermal decomposition film between the die 201 and the carrier plate 200 and between the passive device 202 and the carrier plate 200, the adhesion of the adhesive layer may be reduced after the adhesive layer is heated, so as to strip the carrier plate 200. By heating the adhesive layer to strip the carrier plate 200, the damage to the die 201 and the passive device 202 during the stripping can be minimized. Of course, in other embodiments, the carrier plate 200 may be directly mechanically stripped.

After the carrier plate 200 is stripped, a lower surface of the encapsulation layer 204, a surface of the substrate layer 302, a surface of the protective layer 203, surfaces of the first electrical connection portions 3021, and the pads at the protective-layer openings 2031 that originally face toward the carrier plate 200 may be exposed. In this way, after the carrier plate 200 is stripped, a plate structure including the die 201, the passive device 202, the substrate layer 302, the protective layer 203, and the encapsulation layer 204 may be obtained. In the plate structure, except for the protective-layer openings 2031, surfaces of respective components originally near the carrier plate 200 are in the same plane. On the formed plate structure, wiring may be performed according to actual situations to achieve electrical connection of the die 201 and the passive device 202 with the outside, as well as electrical connection of the die 201 with the passive device 202.

Further, as shown in FIG. 12, after the carrier plate 200 is stripped, the protective-layer openings 2031 are filled with a second conductive medium to form second electrical connection portions 2032, and a wiring layer 205 is formed on a surface of the substrate layer 302 away from the passive device 202 and a surface of the protective layer 203 away from the die 201. The wiring layer 205 is formed on the surface of the substrate layer 302, the surface of the protective layer 203, and a surface of the encapsulation layer 204 on a same side. The wiring layer 205 is electrically connected to the first electrical connection portions 3021 and the second electrical connection portions 2032. Specifically, the wiring layer 205 is electrically connected to the electrical connectors of the passive device 202 through the first electrical connection portions 3021, and to the pads 2011 on the front surface of the die 201 through the second electrical connection portions 2032.

It should be noted that, in some embodiments, the second electrical connection portions 2032 and the wiring layer 205 are formed in the same conductive layer process. Of course, in other embodiments, the second electrical connection portions 2032 and the wiring layer 205 may not be formed in the same conductive layer process.

It should be noted that, if the first electrical connection portions are not formed in the substrate-layer openings before step 105, after the carrier plate 200 is stripped, the method further includes filling the substrate-layer openings with the first conductive medium to form the first electrical connection portions 3021.

Optionally, in some embodiments, the first electrical connection potions 3021, the second electrical connection portions 2032, and the wiring layer 205 are formed in the same conductive layer process.

In other embodiments, the first electrical connection portions 3021, the second electrical connection portions 2032, and the wiring layer 205 may not be formed in the same conductive layer process. For example, in some embodiments, the first electrical connection portions 3021 and the second electrical connection portions 2032 are formed in the same conductive layer process. Afterwards, the wiring layer 205 is formed in another conductive layer process. Of course, the first electrical connection portions, the second electrical connection portions, and the wiring layer may be formed respectively in different wiring layer processes, which is not limited in the present application and may be set according to specific application environments.

It should be noted that the second electrical connection portions 2032 may be formed before step 105, and accordingly, after the carrier plate is stripped, the wiring layer may be directly disposed.

Further, in some embodiments, after the carrier plate 200 is stripped, the method includes:

forming a reinforcing rib on an outer surface of the space between the passive device 202 and the die 201.

The outer surface of the space between the passive device 202 and the die 201 mentioned here may be understood as a surface of the encapsulation layer 204 at the space between the passive device 202 and the die 201, as well as a surface of the substrate layer 302 away from the passive device 202 and a surface of the protective layer 203 away from the die 201 near the space between the passive device 202 and the die 201. Optionally, materials and structure of the reinforcing rib may be the same as or similar to that of the wiring layer 205. The reinforcing rib is not electrically connected to other electrical structures. In some embodiments, the reinforcing rib may be formed in the same process as the wiring layer 205.

Further, as shown in FIG. 13, after the wiring layer 205 is formed, third electrical connection portions 206 are formed on a surface of the wiring layer 205 away from the die 201 and the passive device 202.

Figure 14:
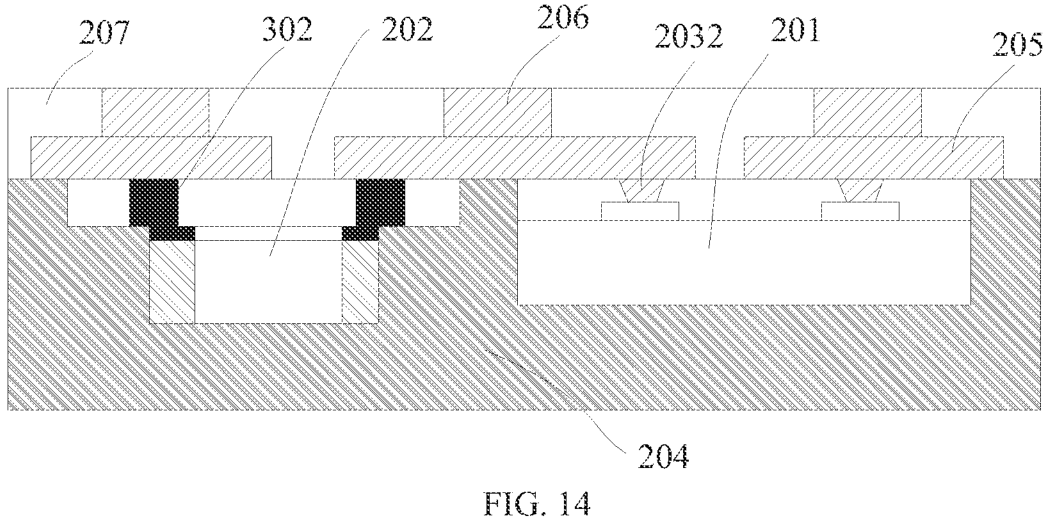

Further, as shown in FIG. 14, a dielectric layer 207 is formed on the wiring layer 205 to protect the wiring layer 205 and the third electrical connection portions 206. The dielectric layer 207 covers exposed portions of the wiring layer 205, portions of the third electrical connection portions 206, exposed portions of the protective layer 203, and exposed portions of the substrate layer 302, and surfaces of the third electrical connection portions 206 away from the wiring layer 205 are exposed from the dielectric layer 207. A thickness of the formed dielectric layer 207 may correspond to surfaces exactly exposing third electrical connection portions 206. The dielectric layer 207 may also cover all exposed surfaces of the encapsulation layer 204, the substrate layer 302, the protective layer 203, and the wiring layer 205, and then the thickness of the formed dielectric layer 207 is reduced to surfaces of the third electrical connection portions 206.

The third electrical connection portions 206 are preferably circular, and of course, may also be rectangular, square, etc., and the third electrical connection portions 206 are electrically connected to the wiring layer 205. Specifically, the third electrical connection portions 206 may be formed on the wiring layer 205 through photolithography and electroplating.

In another embodiment, after the wiring layer 205 is formed, the dielectric layer 207 may be continuously formed on the wiring layer 205, and the exposed portions of the substrate layer 302, protective layer 203 and encapsulation layer 204. The dielectric layer 207 has dielectric layer openings. Then, the third electrical connection portions 206 electrically connected to the wiring layer 205 are formed in the dielectric layer openings of the dielectric layer 207.

In an embodiment, the dielectric layer 207 may be formed through lamination, molding or printing, preferably, by using an epoxy compound.

Optionally, in some embodiments, rewiring may be performed outside the third electrical connection portions. For example, one or more wiring layers may be formed outside the dielectric layer in the same way to achieve the multilayer wiring of a product.

Further, in some embodiments, after the dielectric layer 207 is formed, the method includes:

forming outer connection pins 208 on the surfaces of the third electrical connection portions 206 away from the wiring layer 205.

Materials for the outer connection pins 208 may include tin. Correspondingly, the outer connection pins 208 may be formed through tinplating. Of course, in other embodiments, the materials for the outer connection pins may be other materials, such as copper, nickel-based alloys, or other metal materials that can achieve electrical connection. The outer connection pins may be formed through other manners, which is not limited in the present application and may be set according to specific circumstances.

Figure 3:
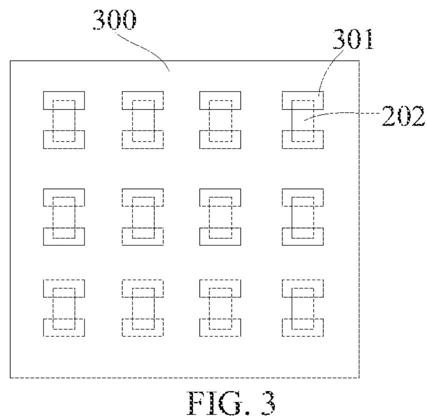

Further, after the outer connection pins 208 are formed, if multiple groups of dies and passive devices are disposed, an entire package structure is cut into multiple package bodies (i.e., semiconductor package structures, for example, a semiconductor package structure shown in FIG. 3) through laser or mechanical cutting.

Figure 15:
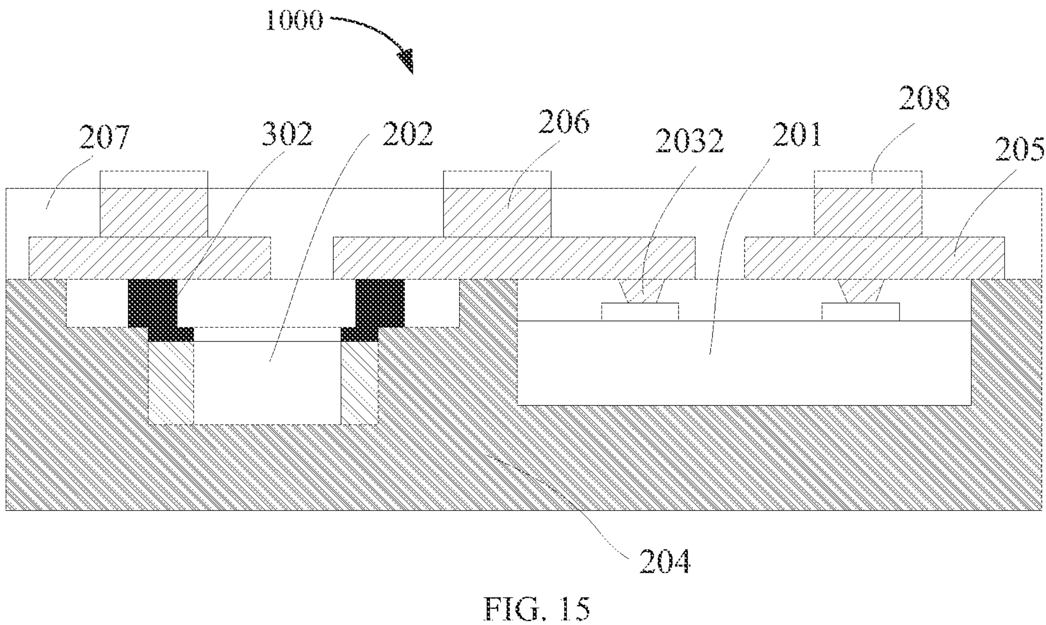

FIG. 15 is a schematic diagram illustrating a semiconductor package structure 1000 obtained from the semiconductor package method according to an exemplary embodiment of the present application. Referring to FIG. 15 and, if necessary, with reference to FIGS. 1-14, the semiconductor package structure 1000 includes:

a passive device 200, where a front surface of the passive device 202 is provided with electrical connectors, a substrate layer 302 is disposed on the front surface of the passive device 202, the substrate layer 302 is provided with substrate-layer openings that run through two opposite surfaces of the substrate layer 302, the substrate-layer openings correspond to the electrical connectors, and first electrical connection portions 3021 are formed in the substrate-layer openings;

a die 201, where a front surface of the die 201 is provided with pads, a protective layer 203 is formed on the front surface of the die 201, protective-layer openings 2031 are formed on the protective layer 203, the protective-layer openings 2031 correspond to the pads 2011 on the front surface of the die 201, and second electrical connection portions 2032 are formed in the protective-layer openings 2031;

an encapsulation layer 204 that encapsulates at least side surfaces of the die 201 and side surfaces of the passive device 202;

a wiring layer 205 disposed on a surface of the substrate layer 302 away from the passive device 202 and a surface of the protective layer 203 away from the die 201, and electrically connected to the electrical connectors of the passive device 202 through the first electrical connection portions 3021 and to the pads on the front surface of the die 201 through the second electrical connection portions 2032.

Further, the semiconductor package structure 1000 may further include a dielectric layer 207. The dielectric layer 207 is formed on the wiring layer 205, and on exposed portions of the substrate layer 302, protective layer 203, and encapsulation layer 204, and has dielectric layer openings. The dielectric layer openings are provided with third electrical connection portions 206 electrically connected to the wiring layer 205.

In this embodiment, for all structural components of the semiconductor package structure, reference may be made to the relevant description of corresponding structural components in the semiconductor package method, which will not be repeated here.

In the present application, apparatus embodiments and method embodiments may be supplemented to each other in a case of no conflict.

The above described are only preferred embodiments of the present application, which are not intended to limit the application. Any modification, equivalent replacement, improvement, etc. made within the spirit and principle of the present application shall be included in the protection scope of the application.

The invention claimed is:

1. A semiconductor package method, comprising:

providing a passive device and disposing a substrate layer on a front surface of the passive device, wherein the front surface of the passive device is provided with electrical connectors, the substrate layer is provided with substrate-layer openings that run through two opposite surfaces of the substrate layer, and the substrate-layer openings correspond to the electrical connectors;

providing a die, forming a protective layer on a front surface of the die, and forming protective-layer openings on the protective layer, wherein the front surface of the die is provided with pads, and the protective-layer openings correspond to the pads on the front surface of the die;

adhering the passive device and the die to a carrier plate in a spaced-apart manner, wherein the front surface of the die faces toward the carrier plate, and the front surface of the passive device faces toward the carrier plate; and forming an encapsulation layer that encapsulates at least side surfaces of the die and side surfaces of the passive device;

wherein, after forming the encapsulation layer, the method further comprises:

stripping the carrier plate; and forming a reinforcing rib on an outer surface of a space between the passive device and the die.

2. The semiconductor package method according to claim 1, wherein disposing the substrate layer on the front surface of the passive device comprises:

providing a substrate;

forming, on a surface of the substrate, solder joints of multiple passive devices arranged in preset positions;

soldering the multiple passive devices respectively to different solder joints to form passive device assemblies; and cutting the substrate of the passive device assemblies to form passive devices each provided with the substrate layer on the front surface of the passive device.

3. The semiconductor package method according to claim 2, wherein, after cutting the substrate of the passive device assemblies to form passive devices each provided with the substrate layer on the front surface of the passive device, the method further comprises:

providing the substrate-layer openings on the substrate layer.

4. The semiconductor package method according to claim 1, wherein, after forming the encapsulation layer, the method further comprises:

stripping the carrier plate;

filling the substrate-layer openings with a first conductive medium to form first electrical connection portions, filling the protective-layer openings with a conductive medium to form second electrical connection portions, and forming a wiring layer on a surface of the substrate layer away from the passive device and a surface of the protective layer away from the die, wherein the wiring layer is electrically connected to the electrical connectors of the passive device through the first electrical connection portions and to the pads on the front surface of the die through the second electrical connection portions.

5. The semiconductor package method according to claim 1, wherein, before adhering the passive device and the die to the carrier plate in a spaced-apart manner, the method further comprises:

filling the substrate-layer openings with a first conductive medium to form first electrical connection portions electrically connected to the electrical connectors of the passive device, and filling the protective-layer openings with a second conductive medium to form second electrical connection portions electrically connected to the pads on the front surface of the die.

6. The semiconductor package method according to claim 5, wherein, after forming the encapsulation layer, the method further comprises:

stripping the carrier plate;

forming a wiring layer on a surface of the substrate layer away from the passive device and a surface of the protective layer away from the die, wherein the wiring layer is electrically connected to the electrical connectors of the passive device through the first electrical connection portions and to the pads on the front surface of the die through the second electrical connection portions.

7. The semiconductor package method according to claim 4, wherein, after forming the wiring layer, the method further comprises:

forming third electrical connection portions on a surface of the wiring layer away from the die and the passive device.

8. The semiconductor package method according to claim 7, wherein, after forming the third electrical connection portions, the method further comprises:

forming a dielectric layer on the wiring layer, wherein the dielectric layer covers exposed portions of the wiring layer, portions of the third electrical connection portions, exposed portions of the protective layer, and exposed portions of the substrate layer, and surfaces of the third electrical connection portions away from the wiring layer are exposed from the dielectric layer.

9. The semiconductor package method according to claim 8, wherein, after forming the dielectric layer, the method further comprises:

forming outer connection pins on the surfaces of the third electrical connection portions away from the wiring layer.

10. A semiconductor package structure, comprising:

a passive device, wherein a front surface of the passive device is provided with electrical connectors, a substrate layer is disposed on the front surface of the passive device, the substrate layer is provided with substrate-layer openings that run through two opposite surfaces of the substrate layer, and the substrate-layer openings correspond to the electrical connectors;

a die, wherein a front surface of the die is provided with pads, a protective layer is formed on the front surface of the die, protective-layer openings are formed on the protective layer, and the protective-layer openings correspond to the pads on the front surface of the die;

an encapsulation layer that encapsulates at least side surfaces of the die and side surfaces of the passive device;

wherein a reinforcing rib is formed on an outer surface of a space between the passive device and the die.

11. The semiconductor package structure according to claim 10, wherein first electrical connection portions are formed in the substrate-layer openings, and second electrical connection portions are formed in the protective-layer openings;

wherein the semiconductor package structure further comprises a wiring layer disposed on a surface of the substrate layer facing away from the passive device and a surface of the protective layer facing away from the die, and electrically connected to the electrical connectors of the passive device through the first electrical connection portions and to the pads on the front surface of the die through the second electrical connection portions.

* * * * *